Sept. 9, 1958 G. L. CLAPPER 2,851,604

SIGNAL TRANSLATING APPARATUS

Filed Sept. 4, 1956

INVENTOR.
GENUNG L. CLAPPER

BY Dewey J. Cunningham

ATTORNEY 2,851,604

SIGNAL TRANSLATING APPARATUS

Genung L. Clapper, Vestal, N. Y., assignor to International Business Machines Corporation, New York, N. Y., a corporation of New York Application September 4, 1956, Serial No. 607,668

7 Claims. (Cl. 250—36)

The present invention relates to signal translating apparatus, and particularly to a novel oscillator circuit which produces square wave output pulses.

Briefly, the invention comprises a junction type transistor which is connected in a grounded collector configuration and serves as an emitter follower for an input signal supplied to the base thereof. The output voltage taken from the emitter electrode is clipped and supplied as an input to a complementary inverter driver which employs two junction type transistors of opposite conductivity type. The driver serves to further shape the clipped input thereto into a square wave signal and to invert the input. This square wave signal, which serves as the output of the present invention, is also fed to one end of an LC tank circuit, the other end of said tank circuit being connected to one side of a piezoelectric crystal having a prescribed frequency of operation. The other side of the crystal is referenced to ground. A point intermediate the tank circuit and the crystal is RC coupled to the base of the first described transistor and serves as the input thereto. The operation of the circuit is such that the square wave ouput signal fed to one end of the tank circuit shock excites the tank circuit and results in a sine wave being applied to the base of the transistor which is connected in the grounded collector configuration. This circuit is capable of stable operation at one megacycle and produces square wave output pulses with good drive characteristics. By driving a grounded collector circuit from the tank, no loading is applied to the tank since the grounded collector circuit has a high input impedance.

Accordingly, an object of the present invention is to produce a new and improved oscillator circuit.

Another object of this invention is to furnish an oscillator circuit employing transistors which is capable of stable high speed operation and which produces substantially square wave output pulses having good drive characteristics.

Still another object of the invention is to produce a new and improved oscillator circuit which utilizes its square wave output signal in a feedback arrangement to one side of a tank circuit associated therewith, the voltage at the other side of the tank circuit being sinusoidal.

A further object of the present invention is to furnish an oscillator circuit in which an emitter follower circuit is driven from a tank circuit, thereby preventing loading of the tank circuit.

Other objects of the invention will be pointed out in the following description and claims and illustrated in the accompanying drawings, which disclose, by way of examples, the principle of the invention and the best mode, which has been contemplated, of applying that principle.

Figure 1:
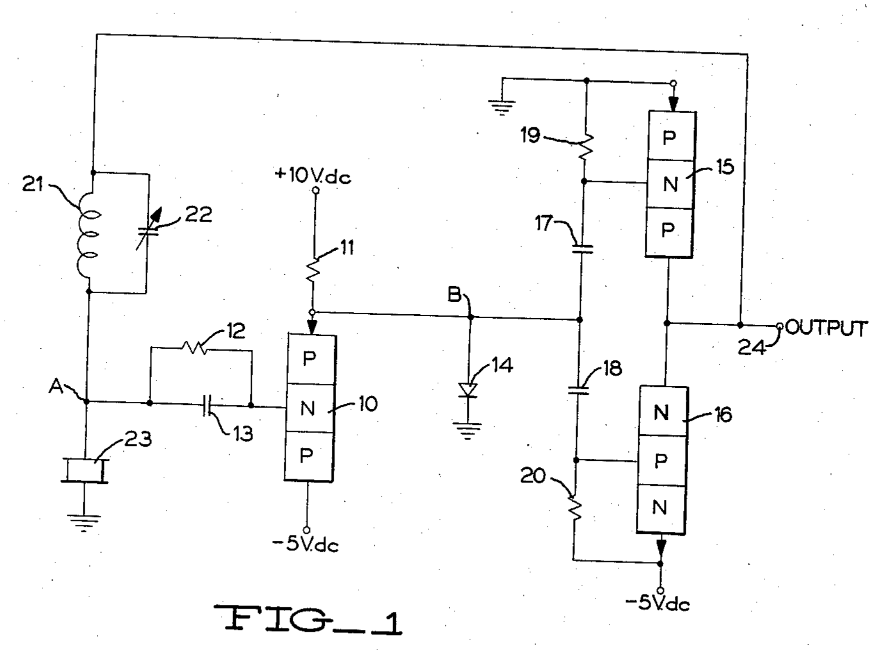
Fig. 1 is a schematic diagram of the present invention.

Referring to Fig. 1, there is provided a PNP junction type transistor having its collector connected to a negative source of D. C. potential and its emitter connected by way of a resistor 11 to a positive source of D. C. potential. The convention used in designating the various electrodes of the transistors shown in Fig. 1 is that for a PNP transistor the emitter electrode is in the form of an arrow pointing toward the upper P-type region of the transistor. The collector is always connected to the lower P-type region and the base electrode is connected to the N-type region. For NPN transistors, the emitter electrode is in the form of an arrow which points away from the lower N-type region. The collector electrode is connected to the upper N-type region while the base electrode is connected to the P-type region.

The base of transistor 10 is connected to point A by way of a resistor 12 having a capacitor 13 in parallel therewith. For the moment, let it be assumed that the voltage appearing at point A is sinusoidal in nature and may be similar to that shown at A in Fig. 2. Thus transistor 10 will go out of conduction during the relatively positive half cycles as the potential in A goes positve, of the input, and will go into conduction during the relatively negative half cycles. This causes the voltage at the emitter of transistor 10 to also fluctuate in a sinusoidal fashion and in the same phase as the voltage appearing at point A. However, the emitter of transistor 10 is connected to the plate of a diode 14 whose cathode is connected to ground. This diode causes the emitter to swing only between −5 volts and ground. That is, when the transistor is in conduction, the voltage at B will be at approximately −5 volts and when the transistor goes out of conduction, the emitter potential will be at approximately ground. This waveform is illustrated at B in Fig. 2.

The output voltage at the emitter of transistor 10 is therefore clipped by the diode 14 and supplied to a complementary inverter which is comprised of a PNP junction type transistor 15 and an NPN junction type transistor 16. Both of these transistors are connected in a grounded emitter configuration, transistor 15 having its emitter connected to ground and transistor 16 having its emitter connected to a negative source of D. C. potential. The collectors of the transistors are commoned and connected to a terminal identified by reference numeral 24. The base of transistor 15 is returned to ground by way of a resistor 19 while the base of transistor 16 is returned to the emitter voltage by way of a resistor 20. The emitter of transistor 10 is coupled to the base of transistor 15 by a capacitor 17 and is coupled to the base of transistor 16 by way of a capacitor 18.

Figure 2:
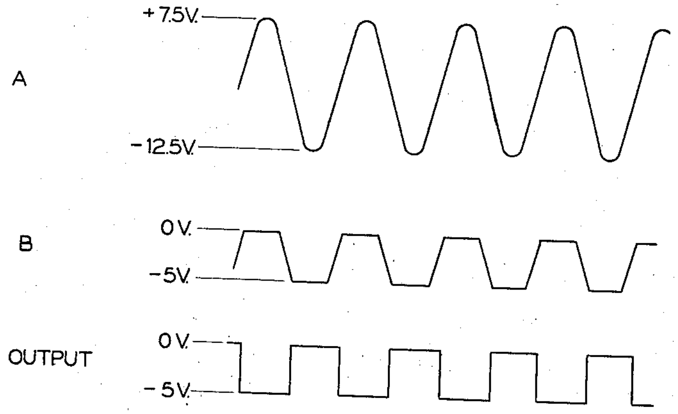
Fig. 2 shows a plurality of sample waveforms for points indicated in the circuit of Fig. 1.

As shown in Fig. 2, the voltage at point B, which is at the emitter of transistor 10, is at −5 volts when the transistor 10 is conducting and at ground when transistor 10 is out of conduction. Therefore, in shifting from −5 volts to ground, a rise in voltage occurs at the base of transistor 16 allowing this transistor to conduct. However, at the same time, a rise in voltage occurs at the base of transistor 15 and places this transistor out of conduction. On the other hand, when the voltage at point B goes from ground to −5 volts, transistor 15 goes into conduction and transistor 16 goes out of conduction. Under these circumstances, the voltage appearing at terminal 24 will be 180° out of phase with the voltage at point B, this voltage being illustrated in Fig. 2 and labeled Output. It is seen that the operation of the circuit including transistors 15 and 16 is such as to further shape the voltage appearing at point B so that it is now substantially a square wave signal.

The output voltage from the common collectors of transistors 15 and 16 is supplied to one end of an LC tank circuit which comprises an inductive element 21 and a variable capacitor 22. The upper end of the tank circuit is connected to point A which is in turn connected to one side of the piezoelectric crystal 23, the other side of said crystal being referenced to ground. From Fig. 2 it will be seen that the square wave voltage supplied to the upper end of the tank circuit is 180° out of phase with the sinusoidal voltage appearing at the other end of the tank circuit. Due to this fact, the entire circuit is allowed to act as an oscillator.

The tank circuit acts as a delay element in the feedback loop to introduce a phase shift of 180° at the chosen operating frequency. When this is added to the 180° effective phase shift of the complementary inverter, a total of 360° phase shift is produced for the entire loop. This is a necessary condition for oscillation.

Another function of the tank circuit is in controlling the frequency of oscillation. The frequency is a function of the inductance and the capacitance of the circuit in accordance with the equation $$f=\frac{1}{2\pi\sqrt{LC}}$$

Where $f$=frequency in cycles per second
$L$=inductance in henries
$C$=capacitance in farads Since both L and C appear in the denominator, increasing either or both will lower the frequency of operation and decreasing either or both will raise the frequency. In the present circuit, the inductance is chosen to be of such a value that a small variable capacitor may be used to adjust the frequency.

The tank circuit also acts as a storage device for energy according to the well-known "flywheel effect." Energy stored by the charge in the capacitance is maximum when the voltage is maximum. At this time the current in the circuit is zero, so that the energy stored in the magnetic field of the inductance is zero. When the capacitor discharges until the voltage across the circuit is zero, the energy stored in the capacitor is zero, but the current in the coil is maximum, so that the energy stored in the magnetic field is maximum. As the field collapses, voltage is induced in the coil which causes the charge on the capacitor to increase, etc. In this way energy is transferred from one reactive element to the other, the voltage across the elements varying in a sinusoidal manner as shown at waveform A, Fig. 1. A small amount of energy is lost in the form of heat as the circulating currents of the tank circuit flow through the resistance of the circuit. This must be replaced by energy from an external source. Although this is often accomplished by some form of inductive or capacitive coupling, in this embodiment, power is supplied by direct connection to the output. As shown in the waveforms, the voltage changes occur at the right time to increase the charge on the capacitor and thus add to the total energy of the tank circuit. Since energy is added more often than is required to maintain oscillation, the signal amplitude at point A builds up to a value that is about four times the output amplitude. This permits the use of a piezoelectric crystal for fixed frequency control.

The addition of the piezoelectric crystal adds stability to the circuit by introducing an element which is relatively unaffected by changes in temperature or voltage. It is a well-known property of the properly cut crystal that a change in voltage across the crystal results in a dimensional change. This causes a change in pressure from the retaining plates which in turn creates a change in voltage across the crystal. The crystal dimensions determine the frequency of oscillation in the mechanical mode, so that the electrical oscillation also resonates at a fixed frequency.

It will be seen that I have provided a novel oscillator circuit employing transistors. This circuit is capable of stable high speed operation and results in the production of square wave output pulses having good drive characteristics. By using transistor 10 in a grounded collector configuration, the transistor offers a high impedance to the input signal and thereby avoids loading the tank circuit. The circuit has been reliably operated at one megacycle and used to drive a number of transistor circuits.

While there have been shown and described and pointed out the fundamental novel features of the invention as applied to a preferred embodiment, it will be understood that various omissions and substitutions and changes in the form and details of the device illustrated and in its operation may be made by those skilled in the art, without departing from the spirit of the invention. It is the intention, therefore, to be limited only as indicated by the scope of the following claims.

What is claimed is:

1. An oscillator comprising a transistor having a base, an emitter and a collector, a plurality of different voltages, connecting means connecting the emitter and the collector, respectively, to appropriate ones of said different voltages, an impedance element interposed in the connecting means to the emitter, inverter means connected to said emitter, and means including a tank circuit for coupling the output of said inverter means to said base.

2. An oscillator comprising a transistor having a base, an emitter and a collector, a plurality of different voltages, connecting means connecting the emitter and the collector, respectively, to appropriate ones of said different voltages, an impedance element interposed in the connecting means to the emitter, inverter means connected to said emitter, an output terminal connected to said inverter means, a tank circuit, means connecting one side of the tank circuit to said output terminal, and means connecting the other side of said tank circuit to said base.

3. An oscillator comprising a transistor having a base, an emitter and a collector, a plurality of different voltages, connecting means connecting the emitter and the collector, respectively, to appropriate ones of said different voltages, an impedance element interposed in the connecting means to the emitter, complementary inverter means connected to said emitter, means including a tank circuit for coupling the output of said inverter means to said base, and means having a prescribed frequency of oscillation connected to the base of said transistor, said tank circuit being tuned to the frequency of said last-mentioned means.

4. An oscillator comprising a transistor having a base, an emitter and a collector, a plurality of different voltages, connecting means connecting the emitter and the collector, respectively, to appropriate ones of said different voltages, an impedance element interposed in the connecting means to the emitter, complementary inverter means connected to said emitter, an output terminal connected to said inverter means, a tank circuit, means connecting one side of said tank circuit to said output terminal and means connecting the other side of said tank circuit to the base of said transistor.

5. An oscillator comprising a transistor having a base, an emitter and a collector, a plurality of different voltages, connecting means connecting the emitter and the collector, respectively, to appropriate ones of said different voltages, an impedance element interposed in the connecting means to the emitter, complementary inverter means connected to said emitter, an output terminal connected to said inverter means, a tank circuit, means connecting one side of said tank circuit to said output terminal and the other side to said base, means having a prescribed frequency of oscillation, one side of said means being connected to said reference voltage and the other side thereof being connected to said other side of said tank circuit.

6. An oscillator comprising a transistor having a base, an emitter and a collector, a plurality of different voltages, including a reference voltage, connecting means connecting the emitter and the collector, respectively, to appropriate ones of said different voltages, an impedance element interposed in the connecting means to the emitter, a unidirectional conducting device connected to the emitter and to said reference voltage and oriented to limit the voltage at said emitter to said reference voltage during nonconductive periods of said transistor, inverter means connected to said inverter and means including a tank circuit for coupling the output of said inverter means to said base.

7. An oscillator comprising a transistor having a base, an emitter and a collector, a plurality of different voltages including a reference voltage, connecting means connecting the emitter and collector, respectively, to appropriate ones of said different voltages, an impedance element interposed in the connecting means to the emitter, a unidirectional conducting device connected to said emitter and to said source of reference voltage and oriented to limit the voltage at said emitter to said reference voltage during nonconductive periods of said transistor, an output terminal, complementary inverter driver means connected between said emitter and said output terminal, and means including a tank circuit connected between said output terminal and the base of said transistor.

References Cited in the file of this patent

UNITED STATES PATENTS

| | | |
|---|---|---|
| 2,768,296 | Herzog | Oct. 23, 1956 |
| 2,791,644 | Sziklai | May 7, 1957 |